`US010273574B2`

United States Patent
Harutyunyan

(10) Patent No.: US 10,273,574 B2
(45) Date of Patent: Apr. 30, 2019

(54) METHOD FOR CONTINUOUS PRODUCTION OF HIGH QUALITY GRAPHENE

(71) Applicant: HONDA MOTOR CO., LTD., Minato-ku, Tokyo (JP)

(72) Inventor: Avetik Harutyunyan, Columbus, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/457,763

(22) Filed: Mar. 13, 2017

(65) Prior Publication Data

US 2017/0267534 A1    Sep. 21, 2017

Related U.S. Application Data

(60) Provisional application No. 62/310,350, filed on Mar. 18, 2016.

(51) Int. Cl.
*C01B 32/184* (2017.01)
*C23C 16/01* (2006.01)
*C23C 16/26* (2006.01)
*C23C 16/00* (2006.01)
*C23C 16/54* (2006.01)
(Continued)

(52) U.S. Cl.
CPC ............ *C23C 16/01* (2013.01); *C01B 32/186* (2017.08); *C23C 16/003* (2013.01); *C23C 16/26* (2013.01); *C23C 16/545* (2013.01); *B82Y 30/00* (2013.01); *B82Y 40/00* (2013.01); *Y10S 977/734* (2013.01); *Y10S 977/843* (2013.01)

(58) Field of Classification Search
CPC ..... C23C 16/26; C23C 16/01; C01B 31/0453; C01B 31/0407; C01B 31/0415; C01B 31/0423; C01B 31/043; C01B 31/0438; C01B 31/0446; C01B 31/0461; C01B 31/0469; C01B 31/0476; C01B 31/0484; C01B 31/0492; C01B 2204/00; C01B 2204/02; C01B 2204/04; C01B 2204/06; C01B 2204/065; C01B 2204/20; C01B 2204/22; C01B 2204/24; C01B 2204/28; C01B 2204/30; C01B 2204/32; C01B 31/04; Y10S 977/734; Y10S 977/843; B82Y 40/00; B82Y 30/00
See application file for complete search history.

(56) References Cited

U.S. PATENT DOCUMENTS 8,492,753 B2   7/2013   Yager
8,632,855 B2   1/2014   Wenxu et al.
(Continued)

FOREIGN PATENT DOCUMENTS

WO   WO 2013/179561 A1   12/2013

OTHER PUBLICATIONS

Metals—Melting Temperatures, accessed online at: https://www.engineeringtoolbox.com/melting-temperature-metals-d_860.html on Apr. 1, 2018.*

(Continued)

*Primary Examiner* — Daniel McCracken
(74) *Attorney, Agent, or Firm* — Arent Fox LLP

(57) ABSTRACT

A continuous method for manufacturing graphene films using a metal substrate, wherein a first surface of the metal substrate is heated such that a top layer of the first surface melts to form a molten metal layer, and devices for carrying out the same.

21 Claims, 4 Drawing Sheets

(51) Int. Cl.
*C01B 32/186* (2017.01)
*B82Y 30/00* (2011.01)
*B82Y 40/00* (2011.01)

(56) References Cited

U.S. PATENT DOCUMENTS

| | | | |
|---|---|---|---|
| 8,652,946 B2 | 2/2014 | Sumant et al. | |
| 8,685,843 B2 | 4/2014 | Li et al. | |
| 2013/0122220 A1* | 5/2013 | Won | B82Y 30/00 427/595 |
| 2013/0273723 A1 | 10/2013 | Sumant | |
| 2013/0316167 A1 | 11/2013 | Yager et al. | |
| 2013/0323158 A1 | 12/2013 | Xu et al. | |
| 2014/0054505 A1 | 2/2014 | Tse et al. | |

OTHER PUBLICATIONS

Bae, et al., "Roll-to-roll production of 30-inch graphene films for transparent electrodes," Nature Nanotechnology, vol. 5, Aug. 2010.
Barnett, et al., "Surface premelting of Cu(110)," The American Physical Society, Physical Review B, vol. 44, No. 7, Aug. 1991.
Geng, et al., "Uniform hexagonal graphene flakes and films grown on liquid copper surface," Proceedings of the National Academy of Science, vol. 109, p. 7992, 2012.
Harutyunyan, A. R., "Uniform hexagonal graphene film growth on liquid copper surface: Challenges still remain," Proceedings of the National Academy of Science, Vo. 109, No. 31, p. 12261, 2012.
Kojima, et al., "Surface melting of copper with (100), (110), and (111) orientations in terms of molecular dynamics simulation," High Temperatures—High Pressures, vol. 34, p. 639-648, 2002.
Mohsin, et al., "Synthesis of Milimeter-Size Hexagon-Shaped Graphene Single Crystals on Resolidified Copper," American Chemical Society, ACSNANO, vol. 7, No. 10, pp. 8924-8931, Sep. 4, 2013.
Paronyan, et al., "Formation of Ripples in Graphene as a Result of Interfacial Instabilities," American Chemical Society, ACSNANO, vol. 5, No. 12, p. 9619-9627, Nov. 17, 2011.
Wu, et al., "Reply to Harutyunyan: Continuous and uniform graphene film grown on liquid Cu surface," PNAS, vol. 109, No. 31, Jul. 31, 2012.
Wu, et al., "Triggering the Continuous Growth of Graphene toward Millimeter Size Grain," Advanced Functional Materials, vol. 23, Issue 2, p. 198-203, Jan. 14, 2013.

* cited by examiner

US 10,273,574 B2

METHOD FOR CONTINUOUS PRODUCTION OF HIGH QUALITY GRAPHENE

CROSS-REFERENCE TO RELATED APPLICATIONS

This application claims the benefit of U.S. Provisional Patent Application No. 62/310,350, entitled "Method for Continuous Production of High Quality Graphene," filed on Mar. 18, 2016, which is expressly incorporated by reference herein in its entirety.

FIELD OF THE INVENTION

The present disclosure relates to a continuous method for manufacturing high quality graphene films using metal substrates.

BACKGROUND

Graphene, an allotrope of carbon forming a two-dimensional, atomic-scale, hexagonal lattice, has become useful for applications in flexible electronics due to its exceptional electrical, mechanical, and chemical properties. In order to realize practical applications of graphene, large-scale production methods such as chemical vapor deposition (CVD) on transition metal surfaces have been increasingly explored. In particular, copper has become a popular catalytic substrate due to its low carbon solubility at typical growth temperatures.

However, it has been observed that a strictly two-dimensional graphene system is often thermodynamically unstable, and frequently exists only through perturbations in a third direction. These fluctuations in the third direction generally result in a crumpled topography of the graphene sheet surface, such as "ripples" thereon. It is currently understood that graphene ripples may be associated with (a) the problem of thermodynamic stability of two-dimensional layers or membranes; (b) the thermal expansion coefficient difference between a metal substrate and graphene; and/or (c) the presence of grain boundaries on the metal substrate. As graphene surface topography has significant impact on its mechanical, electronic, magnetic, and chemical properties, understanding and controlling the formation of ripples is important for exploiting its excellent properties.

While continuous production methods for preparing a graphene sheet (such as roll-to-roll methods, where vapor containing carbon reacts on a horizontal substrate such as a copper foil) dramatically reduces production price, such methods often correspond with unwanted wrinkles or ripples on the grown graphene surface.

There is thus a need in the art for methods of manufacturing high quality and large surface area graphene, while reducing both production price and unwanted surface topography.

SUMMARY OF THE INVENTION

The present disclosure relates generally to preparing a film comprising graphene, comprising: placing a metal substrate into a processing chamber comprising one or more heating elements and one or more gas supply components; heating the metal substrate to form a molten metal layer on a first surface of the metal substrate, wherein the first surface is a top surface; contacting the molten metal layer with a carbon source gas, such as a gas comprising hydrocarbon, to form a graphene-comprising layer substantially covering the molten metal layer of the first surface of the metal substrate; solidifying the molten metal layer; and optionally separating the graphene-comprising layer to form a film comprising graphene.

DETAILED DESCRIPTION OF THE INVENTION

Figure 1:
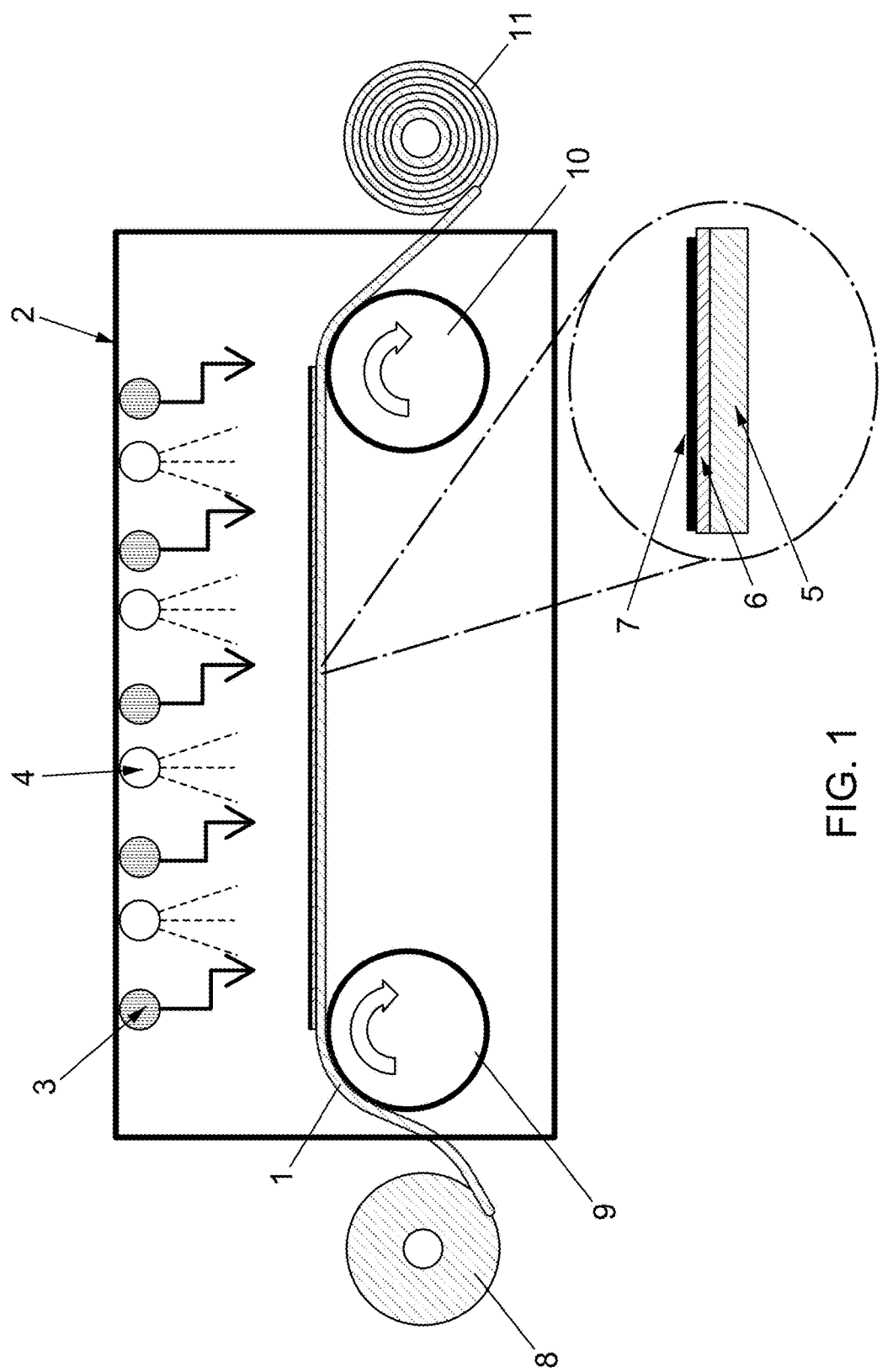
FIG. 1 shows an example of a processing chamber, in accordance with aspects of the present disclosure.

The present disclosure relates generally to continuous methods for producing graphene films on the surface of a metal substrate. According to some aspects, the method comprises a roll-to-roll system. As used herein, "roll-to-roll" processing refers to production continuous methods utilizing a roll or rolls of flexible metal, such as a metal foil. The present disclosure is also directed to devices for carrying out these methods.

According to some aspects, the method of the present disclosure may comprise placing a metal substrate into a processing chamber. In some aspects, the metal substrate comprises a flat surface, and the metal substrate may be a sheet. The metal substrate comprises one or more metals. Examples of metals which may be useful according to the present disclosure include copper, nickel, ruthenium, rhodium, aluminum, and alloys and/or mixtures thereof. According to some aspects, the metal substrate may be placed into the processing chamber by advancing the metal substrate (for example, a sheet of metal foil or a metal film) through the processing chamber.

For example, the metal substrate may comprise a metal foil. According to some aspects, the metal foil may have a thickness of between about 1 and 100 µm, preferably between about 1 and 50 µm, more preferably between about 10 and 40 µm, and most preferably between about 20 and 30 µm. According to some aspects, the metal foil may have a thickness of about 25 µm.

According to some aspects, the metal substrate may comprise a metal film. The metal film may optionally be provided with a second substrate. For example, the metal film may be deposited on one or more surfaces of the second substrate. According to some aspects, the second substrate may comprise a metalloid and/or an oxide thereof, for example, Si and/or $SiO_2$. According to some aspects, the metal film may have a thickness of between about 100 and 1000 nm, preferably between about 100 and 800 nm, more preferably between about 200 and 600 nm, and most preferably between about 300 and 500 nm.

According to some aspects, the metal substrate is continuously advanced through the processing chamber.

According to some aspects, the processing chamber may comprise, for example, one or more rolls configured to advance the substrate through the processing chamber. For example, the processing chamber may comprise one or more unwinding rolls, one or more guide rolls, and/or one or more winding rolls. According to some aspects, the unwinding roll(s) may be a roll from which the substrate is unwound, and/or which adjusts the tensile force of the substrate. According to some aspects, the guide roll(s) may transport the film through the processing chamber. For example, according to some aspects, the chamber may comprise a first guide roll proximal to the unwinding roll, and a second guide roll proximal to the winding roll, wherein one or both of the guide rolls is rotatably driven, for example, by a drive source. According to some aspects, the winding roll may be a roll on which the substrate is wound after graphene has been formed thereon and/or after it has advanced through the processing chamber.

According to some aspects, the processing chamber comprises one or more heating elements and one or more gas supply components. In some embodiments, the processing chamber may comprise an inert atmosphere. Example inert gases for use in the processing chamber include argon, helium, nitrogen, mixtures thereof, and any other inert gases or gas mixtures known in the art.

As used herein, the term "heating element" refers to any element capable of producing heat. According to some aspects, the processing chamber may comprise a heating element which provides heat to only one surface or to more than one surface of the metal substrate as it advances through the processing chamber. According to some aspects, the processing chamber may comprise at least two heating elements, wherein a first heating element or elements provides heat to a first surface of the metal substrate, and a second heating element or elements provides heat to a second surface of the metal substrate, such as a bottom surface. For example, a first heating element or elements may be positioned above the metal substrate to provide heat to a top surface of the substrate, and a second heating element or elements may be positioned below the metal substrate to provide heat to a bottom surface of the substrate. According to some aspects, the two or more heating elements may comprise separate controllers such that the each heating element may be separately controlled. For example, each heating element may comprise a controller which controls the heat provided by the heating element and/or a controller which controls the position of the heating element, for example, the position of the heating element relative to the substrate. According to some aspects, one or more heating elements may be controlled using the same controller. For example, the first heating element or elements may be controlled using a first controller while the second heating element or elements may be controlled using a second controller.

According to some aspects, the processing chamber may comprise multiple heating elements and/or multiple types of heating elements. According to some aspects, the heating element(s) may comprise an IR heater, for example, a heater comprising an IR lamp, and/or a laser heater, for example, a heater comprising a laser. According to some aspects, the heating element(s) may comprise a ceramic heater, a halogen lamp, a laser or the like, a means for heating by an induced current by application of a magnetic field, and/or a means for heating by heat conduction. According to some aspects, the heating element(s) may comprise a graphite heating element. However, it will be appreciated that any suitable heating element capable of providing controlled heat may be used according to aspects of the present disclosure.

According to some aspects, the method of the present disclosure may comprise heating the metal substrate as it continually advances through the processing chamber. For example, as shown in FIG. 1, using rotatably driven guide rolls (9 and 10), a sheet of the substrate (1) may be advanced from an unwinding roll (8) into and through a processing chamber (2) with one or more heating elements (3) therein. According to some aspects, the one or more heating elements (3) may provide a controlled heat to the top surface of the substrate (1) as it advances through the processing chamber (2). According to some aspects, the heating element(s) (3) may provide a heat that is equal to or above the melting point of the substrate (1) or the surface thereof. For example, the heating element(s) (3) may provide heat that is greater than the melting point of copper, and/or greater than the melting point of the surface of a copper substrate. According to some aspects, the substrate may be wound onto the winding roll (11) after graphene has been formed therein.

It will be appreciated that the heat supplied by the one or more heating elements to the top surface of the substrate will depend on the melting point of the specific substrate used, and/or the surface melting point of the substrate used. As used herein, the term "melting point" refers to the temperature at which a solid becomes a liquid at a fixed pressure. According to some aspects, the surface of the substrate may melt at a temperature which is lower than the melting point of its bulk, allowing surface melting at temperatures which are lower than the melting point of the specific metal and/or alloys and/or mixtures thereof comprised by substrate. For example, according to some aspects, surface melting may occur such that a molten surface layer may grow to a thickness of about 10 Å at just below the melting point of the of the specific metal and/or alloys and/or mixtures thereof comprised by substrate. According to some aspects, the melting point of the substrate surface(s) may at least partly depend on the crystal orientation of the substrate.

According to some aspects, the heat supplied to the top surface of the substrate by the heating element(s) may be varied by varying the amount heat output by the heating element(s), and/or the distance between the heating element(s) and the top surface of the substrate. According to some aspects, the heat supplied by the one or more heating elements to the top surface of the substrate may heat the substrate surface to about the same temperature as the melting point of the substrate and/or substrate surface, or within a certain range of the melting point of the substrate and/or substrate surface. For example, the heat supplied by the heating element(s) to the top surface of the substrate may heat the substrate to no more than about 50° C. different than the melting point of the substrate and/or substrate surface, preferably no more about 40° C., even more preferably no more than about 30° C., even more preferably no more than about 20° C., even more preferably no more than about 10° C., and most preferably no more than about 5° C. different than the melting point of the substrate and/or substrate surface.

According to some aspects, the melting point of the substrate and/or substrate surface may depend on one or more factors. For example, the melting point of the substrate and/or substrate surface may at least partly depend on particular process conditions (for example, the composition, pressure, and/or density of the atmosphere in the processing chamber) and/or the specific metal and/or alloys and/or mixtures thereof comprised by substrate. According to some aspects of the disclosure, the melting point of the substrate and/or substrate surface may be different than the conventional melting point of the specific metal and/or alloys and/or mixtures thereof comprised by substrate.

According to some aspects, the atmosphere of the processing chamber may have a predetermined pressure. For example, according to some aspects, the pressure may be between about $10^{-8}$ atm and 100 atm, optionally between about $10^{-7}$ atm and 50 atm, and optionally between about $10^{-7}$ atm and 20 atm. According to some aspects, the pressure may be about 0.0084 atm.

According to some aspects, the atmosphere of the processing chamber may comprise a certain gas composition. For example, according to some aspects, the atmosphere may comprise an inert gas. As used herein, the term "inert" refers to a substance that is not chemically reactive. For example, the atmosphere may comprise an inert gas that reacts with neither the substrate nor the carbon source gas. According to some aspects, the atmosphere may additionally or alternatively comprise gasses that are not inert. Examples of gasses that may be comprised by the atmosphere of the processing chamber include, but are not limited to, argon, helium, nitrogen, hydrogen, and mixtures thereof.

According to some aspects of the present disclosure, the heating element(s) may provide a controlled heat to the top surface of the substrate such that the top surface of the substrate melts, thereby at least partially smoothing any grain boundaries, wrinkles, and/or other imperfections on the top surface of the substrate. According to some aspects, the heating element(s) may output heat at a temperature of and/or heat the top surface of the substrate to a temperature of about 970° C.±30° C. and/or 1050° C.±30° C. and/or 1100° C.±30° C. According to some aspects, the heating element(s) may output heat at a temperature of and/or heat the top surface of the substrate to a temperature of about 527° C., 627° C., 727° C., 997° C., 1017° C., 1027° C., or 1037° C.

According to some aspects, as the metal substrate advances through the processing chamber, a molten metal layer may form on a first surface of the metal substrate, wherein the first surface is the top surface. For example, a top layer of the metal substrate may melt to form a molten metal layer as the surface of the substrate is subjected to heat provided by the heating element(s). According to some aspects, the amount of melting is controlled such that the resultant molten metal layer has a predetermined depth. The depth of the molten metal layer may be controlled, for example, by adjusting the heat provided by the heating element(s), the distance between the heating element(s) and the substrate, and/or the rate at which the substrate advances through the processing chamber.

According to some aspects, at least one additional heating element may be provided in order to control the temperature of a second surface of the metal substrate, for example, the bottom surface of the metal substrate or the opposite surface of the metal substrate. For example, the processing chamber may comprise one or more second heating elements underneath the substrate, wherein the second heating element(s) may supply heat such that the temperature of the bottom surface of the substrate is kept below the melting point of the substrate and/or substrate surface. That is, the second heating element(s) may supply less heat to the substrate than the first heating element(s). For example, the amount of heat output by the first heating element(s) may be greater than the amount heat output by the second heating element(s) and/or the distance between the first heating element(s) and the top surface of the substrate may be less than the distance between the second heating element(s) and the bottom surface of the substrate. In another example, the amount of heat output by the first heating element(s) may be about the same as the amount heat output by the second heating element(s), while the distance between the first heating element(s) and the top surface of the substrate may be less than the distance between the second heating element(s) and the bottom surface of the substrate. In this way, the second heating element(s) may still supply less heat to the substrate than the first heating element(s).

As discussed herein, according to some aspects, the melting point of the substrate and/or substrate surface may depend on one or more factors. According to some aspects, the second heating element(s) may control the second substrate surface temperature to be below a temperature of about 1050° C. According to some aspects, the heating element(s) may output heat at a temperature of and/or heat the second surface of the substrate to a temperature of about 970° C.±30° C. and/or 1050° C.±30° C. and/or 1100° C.±30° C. According to some aspects, the heating element(s) may output heat at a temperature of and/or heat the second surface of the substrate to a temperature of about 527° C., 627° C., 727° C., 997° C., 1017° C., 1027° C., or 1037° C. According to some aspects, the second surface of the substrate does not melt, thus a molten metal layer only forms on one surface of the substrate as it advances through the processing chamber.

According to some aspects, the heat supplied to the bottom surface of the substrate by the second heating element(s) may be varied by varying the amount heat output by the second heating element(s), and/or the distance between the second heating element(s) and the bottom surface of the substrate. According to some aspects, the heat supplied to the bottom surface of the substrate by the second heating element(s) may at least partially depend on the presence of one or more spacers or components between the second heating element(s) and the bottom surface of the substrate.

Figure 4:
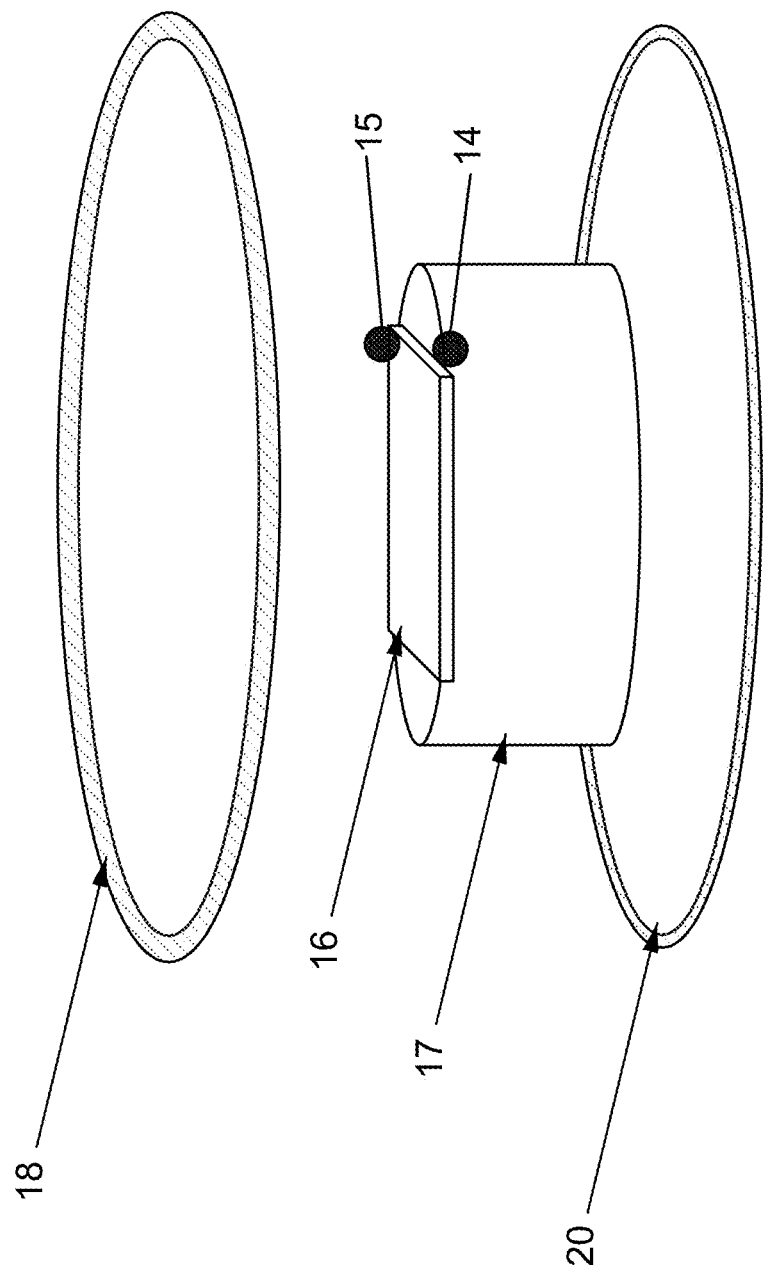
FIG. 4 shows an example of a processing chamber, in accordance with aspects of the present disclosure.

For example, as shown in FIG. 4, the processing chamber may comprise a solid spacer (17) underneath at least a portion of the substrate (16) such that at least the portion of the substrate (16) is separated from the second heating element(s) (20) by the spacer. According to some aspects, the spacer may comprise a solid platform or scaffold. According to some aspects, the spacer may transmit some or all of the heat supplied by the heating element(s). According to some aspects, the processing chamber may comprise at least one temperature sensor, for example, a thermocouple. For example, the processing chamber may comprise a first thermocouple (15) and a second thermocouple (14) in order to measure the temperature of the surface of the substrate (16) facing the first heating element(s) (18) and the second heating element(s) (20), respectively.

According to some aspects, the method comprises contacting the molten metal layer or layers with a carbon source gas. According to some aspects, the carbon source gas is a gas comprising hydrocarbon. The carbon source gas may be provided using one or more gas supply components which are contained in the processing chamber. The one or more gas supply components refers to any mechanism that can provide a gas (e.g., a carbon source gas, such as a gas which comprises one or more hydrocarbons) and/or is capable of depositing the gas onto a molten metal layer of the metal substrate.

According to some aspects, depositing of the carbon source gas onto the surface of the substrate may be accomplished using chemical vapor deposition (CVD). Example carbon source gases for use in the processing chamber include methane, ethylene, acetylene, ethanol, benzene, methanol, carbon monoxide, carbon dioxide, carbon-based polymer, a nano-carbon material, mixtures thereof, and/or any other gases or gas mixtures known in the art. According to some aspects, the contacting of the molten metal layer with a carbon source gas allows for the formation of a graphene-comprising layer. According to some aspects, the graphene-comprising layer substantially covers or completely covers the portion of the surface of the molten metal layer that is contacted with the carbon source gas. "Substantially cover" refers to more than 50%, preferably more than 70%, more preferably more than 80%, even more preferably more than 90%, and even more preferably more than 95% of the surface area of the surface is covered. In some aspects, the surface is completely (about 100%) covered. For example, as shown in FIG. 1, the processing chamber may one or more comprise a gas supply components (4) which emits a hydrocarbon gas capable of forming graphene on the surface of the substrate via CVD. As shown in FIG. 1, according to some aspects, the one or more gas supply components (4) may provide a hydrocarbon gas to a first surface of the substrate, that is, the surface of the substrate with the molten metal layer formed thereon.

In addition to the carbon source gas, the one or more gas supply components may provide one or more secondary gasses. Examples of secondary gasses for use in the processing chamber include argon, helium, nitrogen, hydrogen, and mixtures thereof. For example, the one or more gas supply components may provide the carbon source gas to the processing chamber along with the one or more secondary gasses as a transport gas. Alternatively or additionally, the one or more secondary gasses may be provided before and/or after the carbon source gas has been provided to the processing chamber. According to some aspects, the one or more secondary gasses may be provided to the processing chamber via a different gas supply component than the gas supply component(s) used to provide the carbon source gas. For example, the processing chamber may comprise one or more secondary gas supply components which provide the one or more secondary gasses to the processing chamber.

According to some aspects, the gas supply component(s) and/or the secondary gas supply component(s) may provide their respective gasses at a certain flow rate, which may be the same or different for each gas. For example, according to some aspects, nitrogen gas may be provided at a flow rate of about 200 sccm, argon gas may be provided at a flow rate of 600 about sccm, hydrogen gas may be provided at a flow rate of about 40 sccm, and methane may be provided at a flow rate of about 10 sccm. According to some aspects, the flow rates of the carbon source gas and/or the one or more secondary gasses into the processing chamber may be selected in order to provide a certain flow rate ratio. For example, the flow rate ratio of nitrogen gas to argon gas to hydrogen gas to methane may be about 20:60:40:1

The gas supply component(s) and/or the secondary gas supply component(s) may be arranged such that they emits their respective gasses contemporaneously with the one or more heating elements providing heat to the substrate. Alternatively or additionally, one or more heating elements may provide heat to the substrate prior to the introduction of the gasses from the gas supply component(s) and/or the secondary gas supply component(s). For example, the processing chamber may comprise a preheating zone wherein one or more heating elements provides heat to the metal substrate in order to form a molten metal layer with a desired thickness, as described herein. The substrate may then continue to a processing zone of the processing chamber comprising the gas supply component(s) and/or the secondary gas supply component(s) and/or one or more additional heating elements as described herein. Alternatively or additionally, the preheating zone may comprise one or more secondary gas supply components in order to provide one or more secondary gasses. For example, according to some aspects, the preheating zone may comprise one or more secondary gas supply components that provide hydrogen gas to the processing chamber, while the processing zone may comprise one or more gas supply components that provide a carbon source gas along with a transport gas comprising argon, helium, and/or nitrogen.

According to some aspects, the method of the present disclosure allows direct synthesis of a uniform layer of graphene directly on the molten metal layer of the substrate. For example, as shown in FIG. 1, the solid substrate (5) may comprise a molten metal layer (6) on one surface, with a uniform layer of graphene (7) formed thereon. In some preferred embodiments, this direct synthesis reduces and/or eliminates the grain boundaries that are observed when using, for example, solid polycrystalline copper. According to some aspects, the resultant graphene layer thus comprises a uniform nucleation distribution and low graphene nucleation density.

According to some aspects, the substrate may advance through the processing chamber at a predetermined rate. For example, the substrate may advance through the processing chamber at a rate which provides the desired amount of graphene growth. For example, the rate may be selected in order to provide a certain growth time (i.e., a certain amount of time the substrate is in contact with the carbon source gas). According to some aspects, the rate may be selected in order to provide about 30 minutes of growth time, optionally about 20 minutes of growth time, optionally about 10 minutes of growth time, and optionally about 5 minutes of growth time. It should be understand that the growth time required to provide a desired amount of graphene growth may at least partly depend on particular process conditions (for example, the composition, pressure, and/or density of the atmosphere in the processing chamber) and/or the specific metal and/or alloys and/or mixtures thereof comprised by substrate.

According to some aspects, the heat provided by the one or more heating element(s) and/or the rate at which the substrate advances through the processing chamber may be selected in order to achieve a predetermined molten metal layer thickness. The molten metal layer may have a predetermined thickness that corresponds, for example, to a thickness of the substrate. For example, according to some aspects, if the substrate is about 25 μm thick (e.g., a copper or copper alloy foil having a thickness of about 25 μm), the predetermined molten metal layer thickness may be between about 100 and 1000 nm, preferably between about 200 and 800 nm, more preferably between about 300 and 700 nm, and most preferably between about 450 and 550 nm. According to some aspects, the predetermined molten metal layer thickness may be achieved prior to the substrate advancing out of the preheating zone of the processing chamber and/or may be maintained in the processing zone of the processing chamber.

According to some aspects, the predetermined molten metal layer thickness may correspond to the critical Marangoni number, which is related to Benard-Marangoni convection. In particular, a molten metal may show solutal or thermal instabilities driven by variations in surface tension, which can be described for instance by Benard-Marangoni convection. According to some aspects, the thickness of the molten metal layer may be selected such that the solutal Marangoni number for the surface-melted metal-carbon system is lower than the critical number $M_a^s < M_C = 80$, which prevents the convection flow in the melted layer and thereby prevents formation of cellular ripples on the surface of the melted layer. As it is used herein, the "solutal Marangoni number" refers to:

$$M_a^s = \frac{\gamma_c d \Delta c}{\mu D_L}$$

where $\gamma_c$ is solutal surface tension coefficient, $\Delta c$ is the concentration gradient across the melt ($\Delta c = c_{LG} - c_{SL}$, $c_{SL}$ being the bulk concentration at the solid-liquid interface and $c_{LG}$ being the concentration at the liquid-gas interface), d is the thickness of the molten metal layer, $D_L$ is the molecular diffusivity in the liquid, and μ is the dynamic viscosity.

According to this equation, $\gamma_c$, i.e., the solutal surface tension coefficient, can be described as:

$$\gamma_C = \frac{d_\sigma}{d_0}$$

which is defined through the surface tension as:

$\sigma = \sigma_0 + \gamma_c(\tilde{c} - c_0)$, where $\tilde{c}$ is the excess solute concentration on liquid-gas interface, and $\sigma_0$ and $c_0$ are reference positive values. In the reference steady state, the fluid is at rest with constant excess solute concentration $c_0$ and the unperturbed bulk concentration c is given by:

$c = c_{SL} - \beta_z$, where $c_{SL}$ is bulk concentration at the solid-liquid interface and β is the bulk concentration gradient and is positive when the solute flux is from solid to liquid and negative if the solute is absorbing from the gas phase. In the case of positive values, the solutal surface tension coefficient can be described by:

$$\gamma = \frac{\sigma - \sigma_0}{\tilde{c} - c_0}$$

According to some aspects, the molten metal layer thickness may be selected such that variations in surface tension between the molten metal layer and the carbon layer, described for instance by Benard-Marangoni convection, may be minimized. In this way, the formation of domains and/or cells based on solutal or thermal instabilities, typically observed when using a liquid layer of metal with an adsorbate on the surface thereof, may be reduced.

According to some aspects, after the formation of the graphene-comprising layer, the molten metal layer may be solidified. According to some aspects, the method of the present disclosure comprises advancing the sheet of metal substrate with the graphene layer formed thereon out of the processing chamber such that the molten metal layer solidifies outside of the processing chamber. For example, when the sheet of metal substrate is no longer subjected to heat from the heating element(s) in the processing chamber, the substrate may cool such that the melted layer thereon solidifies. According to some aspects, the molten metal layer may solidify after the substrate is advanced out of the processing chamber. According to some aspects, the molten metal layer may be cooled inside the processing chamber, for example, in a cooling zone of the processing chamber, and may thus solidify before the substrate exits the processing chamber.

According to some aspects, the method of the present disclosure may also comprise separating the graphene-comprising layer from the remainder of the metal substrate.

According to some aspects, the graphene-comprising layer is separated from the molten metal layer and remainder of the metal substrate. The graphene-comprising layer may be separated or removed using any means known in the art. For example, the underlying metal substrate (including the solidified molten layer) may be removed using chemical etching, electrochemical etching, and/or mechanical removal in order to produce a high quality, uniform, large surface area layer comprising graphene.

The present disclosure also relates generally to devices for carrying out the above methods. For example, devices of the present disclosure may comprise a processing chamber comprising an input, at least one heating element, at least one gas supply component, and an output, wherein the device is configured to allow a sheet or film of a metal substrate to be advanced therethrough.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Thus, the claims are not intended to be limited to the aspects shown herein, but are to be accorded the full scope consistent with the language of the claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Further, the word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. Nothing disclosed herein is intended to be dedicated to the public regardless of whether such disclosure is explicitly recited in the claims.

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, dimensions, etc.) but some experimental errors and deviations should be accounted for.

In particular, the following comparative examples (Example 1 and 2) were conducted in order to compare processes of growing graphene on a 15 μm thick copper foil substrate using cold wall CVD (i.e., a CVD method wherein the substrate is heated but the walls of the CVD chamber are cooled) wherein the top and bottom surfaces of the substrate were heated to a certain temperature. The processes were performed using an Aixtron Black Magic CVD system, which comprises two graphite heaters, one above and one below the substrate, which can be controlled separately. Both processes were performed using a pressure of 500 mbar (375 torr) and a gas flow of Ar at 3000 sccm, $H_2$ at 500 sccm, and $N_2$ at 500 sccm (for system cooling). The copper foil substrate was separated from the bottom heater using a quartz spacer. In both examples, the substrate was heated for 10 minutes, and then subjected to a flow of methane gas at a flow rate of 10 sccm as a hydrocarbon source.

EXAMPLE 1

A copper foil substrate was placed into the Aixtron Black Magic CVD system. The top heater was kept at a constant temperature of 1100° C., and the bottom heater was kept at a constant temperature of 1150° C. The top and bottom surface temperatures of the substrate were modified by changing the distance between the substrate surfaces and the top and bottom heaters, respectively. The top surface of the substrate was heated to a temperature of 980° C. (i.e., the temperature used in conventional methods wherein the copper surface is not melted), and the bottom surface was kept at a temperature of less than 1150° C. The bottom surface of the substrate was separated from the bottom heater by the quartz spacer so that the bottom layer of the substrate also did not melt.

Figure 2:
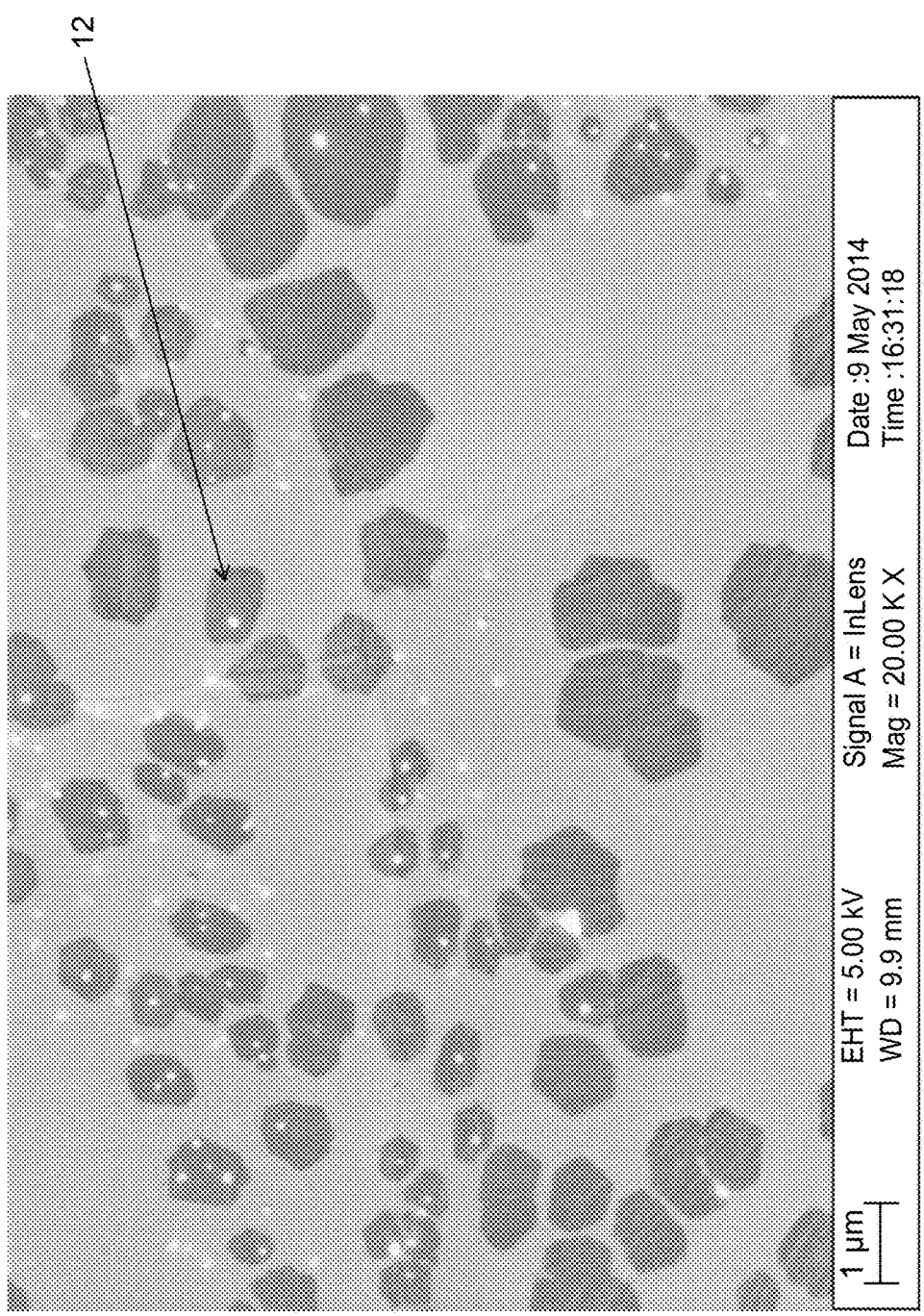
FIG. 2 shows a scanning electron microscope (SEM) image of graphene grains on a copper foil substrate without a molten top layer.

Graphene was grown on the top surface of the substrate, and the resultant layer of graphene was visualized using an SEM as shown in FIG. 2. FIG. 2 shows that the graphene layer comprised small grains (12), indicating the presence of grain boundaries on the substrate surface (i.e., a rough substrate surface).

EXAMPLE 2

A copper foil substrate was placed into the Aixtron Black Magic CVD system. The top heater was kept at a constant temperature of 1100° C., and the bottom heater was kept at a constant temperature of 1150° C. The top and bottom surface temperatures of the substrate were modified by changing the distance between the substrate surfaces and the top and bottom heaters, respectively. The top surface of the substrate was heated to a temperature of 1050° C., and the bottom surface was kept at a temperature of less than 1150° C. The bottom surface of the substrate was separated from the bottom heater by the quartz spacer so that the bottom layer of the substrate also did not melt.

Figure 3:
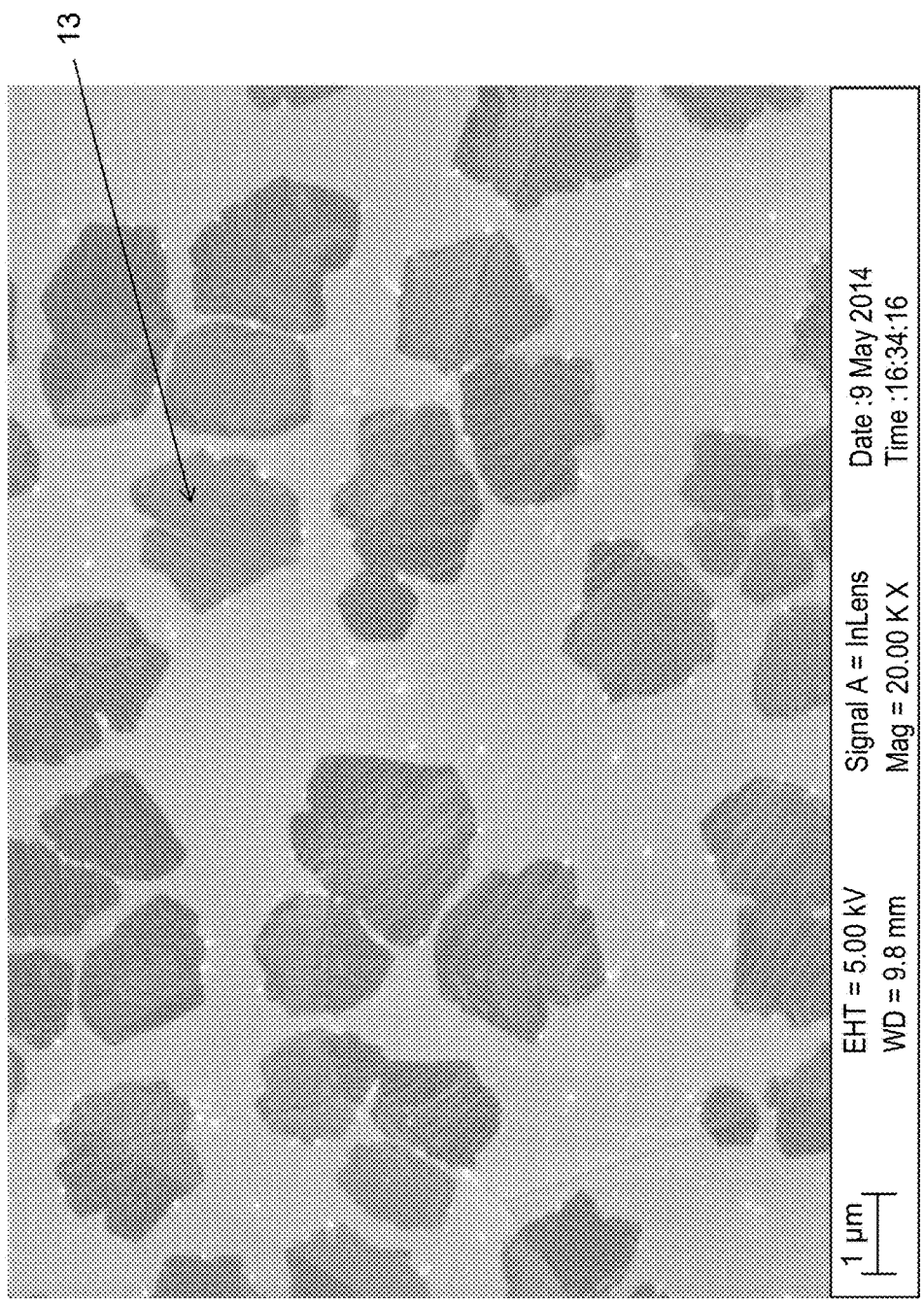
FIG. 3 shows an SEM image of graphene grains on a copper foil substrate with a molten top layer.

Graphene was grown on the top surface of the substrate, and the resultant layer of graphene was visualized using an SEM as shown in FIG. 3. FIG. 3 shows that the graphene layer comprised much larger grains (13) than shown in Example 1, indicating the surface of the copper substrate had likely been melted and thus, was much smoother.

What is claimed is:

1. A continuous method for preparing a film comprising graphene, comprising:

providing a metal substrate;
continuously advancing the metal substrate into and through a processing chamber comprising one or more heating elements and one or more gas supply components, the one or more heating elements comprising at least a first heating element;
heating the metal substrate with the first heating element to form a molten metal layer on a top surface of the metal substrate, wherein the first heating element provides heat to the metal substrate corresponding to a metal substrate temperature that is equal to or above the melting point of the metal substrate;
contacting the molten metal layer with a carbon source gas to form a graphene-comprising layer substantially covering the molten metal layer of the top surface of the metal substrate;
solidifying the molten metal layer;
advancing the metal substrate having the graphene-comprising layer out of the processing chamber; and
separating the graphene-comprising layer to form a film comprising graphene.

2. The method of claim 1, wherein the metal substrate comprises a metal foil or a metal film.

3. The method of claim 1, wherein the processing chamber comprises:
a preheating zone comprising the one or more heating elements,
a processing zone comprising the one or more gas supply components, and
a cooling zone,
wherein the molten metal layer is formed as the metal substrate advances through the preheating zone, the molten metal layer is contacted with the carbon source gas in the processing zone, and the molten metal layer is solidified in the cooling zone.

4. The method of claim 1, wherein the metal substrate is advanced from an unwinding roll into the processing chamber.

5. The method of claim 1, wherein the metal substrate having the graphene-comprising layer is wound onto a winding roll after it has been advanced out of the processing chamber.

6. The method of claim 1, wherein the one or more heating elements comprises at least two heating elements and the one or more gas supply components comprises at least two gas supply components.

7. The method of claim 6, wherein the one or more heating elements comprises the first heating element which heats the top surface of the metal substrate and a second heating element which heats a bottom surface of the metal substrate.

8. The method of claim 1, wherein the metal substrate comprises copper.

9. The method of claim 1, wherein carbon source gas comprises methane, ethylene, acetylene, ethanol, benzene, methanol, carbon-based polymer, nano-carbon material, or a mixture thereof.

10. The method of claim 2, wherein the metal substrate comprises metal foil.

11. The method of claim 10, wherein the metal foil has a thickness of between about 20 and 30 μm.

12. The method of claim 11, wherein the molten metal layer has a thickness of between about 200 and 800 nm.

13. The method of claim 1, wherein the molten metal layer has a thickness such that the solutal Marangoni number ($M_a^s$) is lower than the critical number ($M_C=80$).

14. The method of claim 2, wherein the metal substrate comprises metal film.

15. The method of claim 14, wherein the metal film is deposited on a second substrate.

16. The method of claim 7, wherein the first heating element heats the top surface of the metal substrate to no more than about 50° C. different than the melting point of the top surface of the metal substrate.

17. The method of claim 7, wherein the first heating element and/or the second heating element comprises a IR heater.

18. The method of claim 7, wherein the first heating element heats the top surface of the metal substrate to a temperature of about 1050° C.±30° C.

19. The method of claim 7, wherein the second heating element heats the bottom surface of the metal substrate to a temperature that is below the melting point of the bottom surface of the metal substrate.

20. The method of claim 19, wherein the second heating element heats the bottom surface of the metal substrate to a temperature that is below about 1050° C.

21. A continuous method for preparing a film comprising graphene, the continuous method comprising:

providing a metal substrate;

continuously advancing the metal substrate into and through a processing chamber having a preheating zone comprising one or more heating elements, a processing zone comprising one or more gas supply components, and a cooling zone;

heating the metal substrate with the one or more heating elements of the preheating zone to form a molten metal layer on a top surface of the metal substrate, wherein the one or more heating elements of the preheating zone provides heat to the metal substrate, and wherein the metal substrate is heated to a temperature that is equal to or above the melting point of the metal substrate;

contacting the molten metal layer with a carbon source gas in the processing zone to form a graphene-comprising layer substantially covering the molten metal layer of the top surface of the metal substrate;

solidifying the molten metal layer in the cooling zone;

advancing the metal substrate having the graphene-comprising layer out of the processing chamber; and separating the graphene-comprising layer to form a film comprising graphene.

* * * * *